United States Patent [19]

Auracher et al.

[11] Patent Number: 5,023,949
[45] Date of Patent: Jun. 11, 1991

[54] APPARATUS FOR GENERATING AN FSK-MODULATED OPTICAL SIGNAL HAVING TWO DIFFERENT POLARIZATION CONDITIONS FOR AN OPTICAL TRANSMISSION SYSTEM HAVING AN OPTICAL TWO-FILTER FSK SUPER-HETERODYNE RECEIVER

[75] Inventors: Franz Auracher, Baierbrunn; Alfred Ebberg, Munich; Bernd Noll, Munich; Eckhard Meissner, Munich; Hermann J. Rodler, Bergen, all of Fed. Rep. of Germany

[73] Assignee: Siemens Aktiengesellschaft, Munich, Fed. Rep. of Germany

[21] Appl. No.: 409,820

[22] Filed: Sep. 20, 1989

[30] Foreign Application Priority Data

Sep. 30, 1988 [DE] Fed. Rep. of Germany ....... 3833273

[51] Int. Cl.$^5$ .......................... H01S 3/00; H04B 10/00
[52] U.S. Cl. .................................... 455/618; 455/616; 455/617; 455/619; 455/612; 370/2
[58] Field of Search ............. 455/618, 619, 616, 610, 455/606, 617, 612; 370/2

[56] References Cited

U.S. PATENT DOCUMENTS

| 4,831,663 | 5/1989 | Smith | 455/618 |
| 4,849,960 | 7/1989 | Dakin et al. | 455/610 |
| 4,893,352 | 1/1990 | Melford | 455/619 |
| 4,900,115 | 2/1990 | Heuring et al. | 455/610 |

FOREIGN PATENT DOCUMENTS

| 0168192 | 1/1986 | European Pat. Off. | 455/616 |
| 0325281 | 7/1989 | European Pat. Off. | 455/618 |

OTHER PUBLICATIONS

Electronics Letters, Dec. 4, 1986, vol. 22, No. 25, pp. 1341–1343.
Electronics Letters, Feb. 12, 1987, vol. 23, No. 4, pp. 168–169.
Electronics Letters, May 7, 1987, vol. 23, No. 10, pp. 513–514.
Electronic Letters, Mar. 17, 1988, vol. 24, No. 6, pp. 358–360.

Primary Examiner—Reinhard J. Eisenzopf
Assistant Examiner—Kinfe-Michael Negash
Attorney, Agent, or Firm—Hill, Van Santen, Steadman & Simpson

[57] ABSTRACT

An apparatus for generating an FSK-modulated optical signal has an optical two-filter FSK super-heterodyne receiver. The optical signal has two different polarization conditions that are orthogonal to one another. Due to the two-filter receiver and orthogonal conditions, polarization-independent reception is possible. Conversion of the polarized, optical signal into the optical signal having the orthogonal polarization conditions is accomplished by a switching device. Each condition has a corresponding bit status of a data signal. The data signal effectively controls the polarizatiion of the optical signal. Hence, the frequency boost can be freely selected while maintaining excellent bandwidth characteristics and optimum sensitivity.

3 Claims, 1 Drawing Sheet

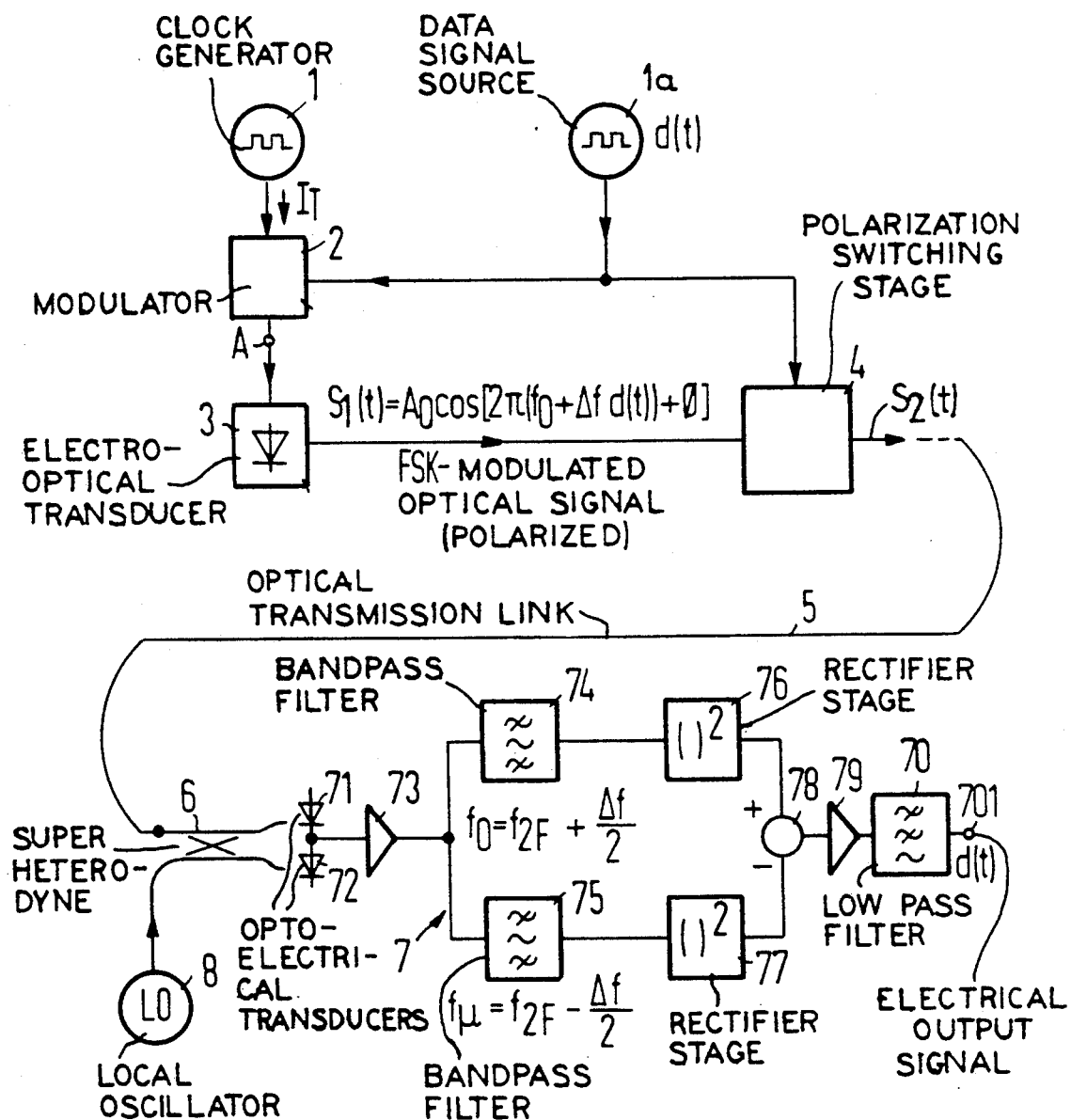

APPARATUS FOR GENERATING AN FSK-MODULATED OPTICAL SIGNAL HAVING TWO DIFFERENT POLARIZATION CONDITIONS FOR AN OPTICAL TRANSMISSION SYSTEM HAVING AN OPTICAL TWO-FILTER FSK SUPER-HETERODYNE RECEIVER

BACKGROUND OF THE INVENTION

1. Field of the Invention

The invention relates to an apparatus for generating an FSK-modulated optical signal for an optical transmission system having an optical FSK super-heterodyne receiver.

2. Description of the Prior Art

In standard optical receivers having super-heterodyne reception, such as optical heterodyne receivers, fluctuation of the amplitude of the intermediate frequency signal is dependent upon the relative position of the polarization conditions of the optical data signal and of the optical signal of a local oscillator. For optimum transmission quality, these fluctuations must be kept as low as possible. Common solutions to this problem are polarization follow-up with a control loop, as disclosed in Electron. Lett. 22 (1986), pp 1341–1343; polarization quadrature reception, Electron. Lett. 22 (1987), pp 168–169; and polarization scrambling, Electron. Lett. 23 (1987), pp 513–514.

The receivers having polarization follow-up theoretically achieve high sensitivity. However, the outlay for the control circuitry in such receivers is considerably large.

Polarization quadrature receivers represent a reliable alternative, but require a division of the optical signals into two sub-signals that are polarized so that they are orthogonal to one another. Each of the sub-signals requires its own receiver.

Both the polarization follow-up and polarization quadrature methods demand an increased outlay in the receiver. This drawback is problematical in many receiver applications.

In polarization scrambling, as opposed to polarization receivers, the increased outlay can be shifted onto the transmitter side. In this method, the polarization condition of the data signal is repeatedly switched between orthogonal polarization stakes in a statistical manner during the bit duration. This allows for the mean value of different polarization conditions to be represented by the intermediate frequency signal. Theoretically, the sensitivity loss in this method compared to the ideal polarization follow-up amounts to at least 3dB. For higher data rates, extremely fast polarization switches are required and the required receiver band width is significantly increased.

It is well-known to have different polarization conditions of an FSK-modulated optical signal that are orthogonal to one another. As in light waveguide links, orthogonal polarization conditions or states remain largely preserved over relatively long optical transmission paths. As a result, polarization-insensitive reception is possible. Such an apparatus is disclosed in Electron. Lett. 24 (1988), pp. 358–360.

The known method for generating the FSK-modulated optical signal, which exhibits the two polarization conditions that are different from one another, is sending the FSK-modulated, polarized optical transmission signal through a highly birefringent medium. After passing therethrough, the two optical frequencies of the FSK-modulated optical transmission signal, the first corresponding to a bit status of 0 and the second corresponding to a bit status of 1, are orthogonal to one another. This condition will only be met for a certain value of the difference between these two frequencies. For this reason, the frequency shift $\Delta f$ must be selected large in comparison to the data rate so that any deviation from the orthogonality will be negligible within the signal bandwidth. In the known method, a frequency shift of $\Delta f - 1$ GHz is selected for a data rate of only 50Mbit/s. This prior art apparatus is limited because it is only suitable for an optical transmission system having an optical two-filter FSK super-heterodyne receiver.

SUMMARY OF THE INVENTION

An object of the invention is to provide an improved optical transmission system with an FSK-modulated optical signal generator and an optical FSK super-heterodyne receiver. An advantage of the invention is that the frequency boost $\Delta f$ can be freely selected and, as a result, the bandwidth and sensitivity at the receiver can be optimized.

The above object is achieved in an optical transmission system constructed in accordance with the principles of the present invention which includes a polarized optical transmission signal and a digital/electrical data signal. The optical transmission signal is converted into a dual transmission signal. This dual signal has two different polarization conditions that are orthogonal to one another. Each condition corresponds to a bit status of the data signal. The data signal controls a switching device which generates the FSK-modulated optical transmission signal of the two polarization conditions. A phase modulator can be used for the switching device. Once the transmission signal is converted to a dual signal then switched to the appropriate polarization condition, it is received by an optical two-filter FSK super-heterodyne receiver.

DESCRIPTION OF THE DRAWING

The figure is a schematic illustration of a preferred embodiment of an apparatus for an optical transmission system constructed in accordance with the principles of the present invention.

DETAILED DESCRIPTION OF THE DRAWINGS

The optical transmission system shown in the figure has a clock generator 1 for generating electrical clock pulses $I_T$. The pulses $I_T$ clock the optical FSK-modulated transmission signal, modulator 2, and a digital/electrical data signal d(t). A data signal d(t) is supplied to the modulator 2 from a source 1a to form an output A which is an electrical FSK-modulated signal that is clocked by the pulses $I_T$. An electro-optical transducer 3, which may be a laser diode, converts the FSK-modulated, electrical signal output at the output A into a corresponding, polarized, and FSK-modulated optical transmission signal $S_1(t)$. A switching device 4 converts the polarized, FSK-modulated transmission signal $S_1(t)$ into an FSK-modulated, optical signal $S_2(t)$ that exhibits two polarization conditions that are orthogonal to one another. An optical transmission link 5, such as an optical fiber, carries the signal $S_2(t)$ to an optical signal super-heterodyne stage 6 at the receiver side of the transmission system. The signal $S_2(t)$ is overlaid with an optical signal of a local oscillator 8 and supplied to an optical, two-filter FSK heterodyne receiver generally designated 7. The digital, electrical data signals d(t) are present at an output 701.

The polarized, FSK-modulated, optical transmission signal $S_f(t)$ can be mathematically expressed by:

$$S_f(t) = A_0 \cos[2\pi(f_0 + \Delta f \cdot d(t)) + \phi]$$

where $A_0$ denotes a signal amplitude, $f_0$ denotes a fundamental light frequency output by the electro-optical transducer, $\Delta f$ denotes the frequency shift, $d(t)$ denotes the digital, electrical data signal and $\phi$ denotes the phase shift. The digital/-electrical data signals d(t) can assume a bit status of either 0 or 1. For a bit status of 0, the electro-optical transducer transmits the fundamental light frequency $f_0$. For a bit status of 1, the electro-optical transducer transmits the light frequency $f_l = f_0 + \Delta f$. The optical super-heterodyne device 6 can be an optical directional coupler.

The known, optical two-filter FSK super-heterodyne receiver 7 includes two receiver diodes 71 and 72 functional as opto-electrical transducers, a following amplifier 73, a band-pass filter 74 for filtering out the upper intermediate frequency $f_0 = f_{2F} + \Delta f/2$, a band-pass filter 75 for filtering out the lower intermediate frequency $f_u = f_{2F} - \Delta f/2$, a rectifier stage 76 allocated to the band-pass filter 74 and a rectifier 77 stage allocated to the band-pass filter 75, a subtractor 78 for subtracting signals from the rectifiers 76 and 77, an amplifier 79 following the subtractor, and a low-pass filter 70 having the output 701.

The transmission system of the present invention shown in the figure has an advantage over prior art devices because there is included a switching stage 4 for switching the polarization condition. This switching stage 4 is controlled by the digital, electrical data signal d(t). The data signal d(t) is supplied with the polarized, FSK-modulated, optical transmission signal $S_f(t)$. This polarization switching stage 4 generates the FSK-modulated, optical signal $S_2(t)$ having the two polarization conditions that are orthogonal to one another. These conditions are generated by frequency shifting or keying the polarization condition of the transmission signal $S_f(t)$ in accord with the two-bit statuses of the digital data signals d(t). The frequency of the optical transmission signal $S_f(t)$ allocated to the one-bit status of the digital, electrical data signal d(t) is transmitted to the receiver 7 in a first polarization condition. The frequency allocated to the other bit status of the data signal d(t) is transmitted to the receiver 7 in a second polarization condition that is orthogonal to the first polarization condition. In accord therewith, for example, the fundamental frequency $f_0$ is transmitted in one polarization condition and the other frequency $f_l$ is transmitted in the second polarization condition.

The polarization switching stage 4 in the optical system of the present invention can be constructed in a simple way with phase modulators that effect different phase shifts for different orthogonal polarization conditions. Lithium niobate ($LiNbO_3$) phase modulators in a waveguide execution can be used for the polarization switching device 4. The linearly polarized, optical transmission signal $S_f(t)$ is coupled at an angle of 45° relative to the principal optical axis of the crystal. The amplitude of the control voltage is set so that the difference in the phase boost between TE-polarized light and TM-polarized light is 180°. Polarization conditions that are orthogonal to one another appear at the output of the phase modulator.

Although modifications and changes may be suggested by those skilled in the art, it is the intention of the inventors to embody within the patent warranted herein, all changes and modifications as reasonably and properly come within the contribution to the art.

We claim as our invention:

1. A transmitter for an optical transmission system for transmitting an optical transmission signal corresponding to an electronic data input signal, said electronic data input signal having first and second states, said transmitter comprising:

modulator means connected to a clock generator and to which said electronic data input signal is supplied for generating an FSK electronic signal having components at a first frequency when said data signal is in said first state and at a second frequency when said data signal is in said second state;

electro-optical transducer means for converting said electronic data signal into a polarized FSK-modulated optical signal; and a polarization switching means to which said polarized FSK-modulated optical signal and said electronic data input signal are supplied for generating an optical transmission signal polarized in a first direction and corresponding to said FSK signal components at said first frequency when said data signal is in said first state and polarized in a second direction, orthogonal to said first direction, and corresponding to said FSK signal components at said second frequency when said data signal is in said second state.

2. A transmitter as claimed in claim 1, wherein said polarization switching means is an integrated optical waveguide consisting of birefringing material.

3. A transmitter as claimed in claim 2, wherein said waveguide consists of lithium niobate.

* * * * *